United States Patent
Pang et al.

(10) Patent No.: US 12,075,674 B2
(45) Date of Patent: Aug. 27, 2024

(54) DISPLAY SUBSTRATE COMPRISING PLANARIZATION LAYER AND DISPLAY DEVICE THEREOF

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yuqian Pang, Beijing (CN); Miao Wang, Beijing (CN); Yunsheng Xiao, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 450 days.

(21) Appl. No.: 17/437,164

(22) PCT Filed: Dec. 9, 2020

(86) PCT No.: PCT/CN2020/134874
§ 371 (c)(1),
(2) Date: Sep. 8, 2021

(87) PCT Pub. No.: WO2022/120633
PCT Pub. Date: Jun. 16, 2022

(65) Prior Publication Data
US 2022/0352297 A1    Nov. 3, 2022
US 2023/0165090 A2    May 25, 2023

(51) Int. Cl.
*H10K 59/131*    (2023.01)
*H10K 50/844*    (2023.01)
(Continued)

(52) U.S. Cl.
CPC ....... *H10K 59/1315* (2023.02); *H10K 50/844* (2023.02); *H10K 59/122* (2023.02);
(Continued)

(58) Field of Classification Search
CPC ............. H10K 59/1315; H10K 59/122; H10K 59/124; H10K 50/844
(Continued)

(56) References Cited

U.S. PATENT DOCUMENTS

2018/0158895 A1* 6/2018 Lee ...................... H10K 59/124
2019/0229177 A1   7/2019 Kim et al.
(Continued)

FOREIGN PATENT DOCUMENTS

CN    108172594 A    6/2018
CN    108549180 A    9/2018
(Continued)

OTHER PUBLICATIONS

International Search Report and Written Opinion issued for International Application No. PCT/CN2020/134874, mailed on Sep. 8, 2021, 13 pages.

*Primary Examiner* — Xia L Cross
(74) *Attorney, Agent, or Firm* — Raj S. Dave; Dave Law Group LLC

(57) ABSTRACT

The present disclosure relates to a display substrate, including: a substrate including a display region and a peripheral region surrounding the display region, the peripheral region including a first wiring region, the first wiring region including a first sub-wiring region disposed along a first direction away from the display region; a first conductive layer located on the substrate; a first dielectric layer located on the first conductive layer; a second conductive layer located on the first dielectric layer; a second dielectric layer located on the second conductive layer; a third conductive layer located
(Continued)

on the second dielectric layer; a third dielectric layer as a planarization layer located on the third conductive layer; a fourth conductive layer located on the third dielectric layer. The fourth wiring is electrically connected to the third wiring. An orthographic projection of the fourth wiring on the substrate at least partially overlaps with an orthographic projection of the third wiring on the substrate.

18 Claims, 7 Drawing Sheets

(51) Int. Cl.
*H10K 59/122* (2023.01)
*H10K 59/124* (2023.01)
*H10K 77/10* (2023.01)
*H10K 102/00* (2023.01)

(52) U.S. Cl.
CPC ......... *H10K 59/124* (2023.02); *H10K 77/111* (2023.02); *H10K 2102/311* (2023.02)

(58) Field of Classification Search
USPC .......................................................... 257/40
See application file for complete search history.

(56) References Cited

U.S. PATENT DOCUMENTS

| | | |
|---|---|---|
| 2020/0243637 A1 | 7/2020 | Lee et al. |
| 2021/0036093 A1 | 2/2021 | Okabe et al. |
| 2021/0124206 A1 | 4/2021 | Li et al. |
| 2021/0399079 A1 | 12/2021 | Yan et al. |

FOREIGN PATENT DOCUMENTS

| | | |
|---|---|---|
| CN | 108732837 A | 11/2018 |
| CN | 110061032 A | 7/2019 |
| CN | 110690365 A | 1/2020 |
| CN | 111354775 A | 6/2020 |
| CN | 211125656 U | 7/2020 |
| CN | 111490073 A | 8/2020 |
| WO | 2019187076 A1 | 10/2019 |

\* cited by examiner

DISPLAY SUBSTRATE COMPRISING PLANARIZATION LAYER AND DISPLAY DEVICE THEREOF

CROSS-REFERENCE TO RELATED APPLICATIONS

The present application is the U.S. National Stage Entry of PCT/CN2020/134874, filed on Dec. 9, 2020, the entire disclosure of which is incorporated herein by reference as part of the disclosure of this application.

TECHNICAL FIELD

Embodiments of the present disclosure relate to the field of displaying technology, and particularly, relate to a display substrate and a display device thereof.

BACKGROUND

In recent years, as technologies and industries have further developed, Organic Light Emitting Diode (OLED) display panels have been widely used in products such as mobile phones, wearable devices, computers, etc.

SUMMARY

Embodiments of the present disclosure provide a display substrate. The display substrate includes: a substrate comprising a display region and a peripheral region surrounding the display region, the peripheral region comprising a first wiring region, the first wiring region comprising a first sub-wiring region disposed along a first direction away from the display region: a first conductive layer located on the substrate, the first conductive layer comprising a first portion located in the peripheral region, the first portion of the first conductive layer comprising a first wiring located in the first wiring region: a first dielectric layer located on the first conductive layer; a second conductive layer located on the first dielectric layer, the second conductive layer comprising a first portion located in the peripheral region, wherein the first portion of the second conductive layer comprises a second wiring located in the first wiring region, the first wiring and the second wiring being spaced apart from each other along a direction parallel to the substrate: a second dielectric layer located on the second conductive layer: a third conductive layer located on the second dielectric layer, the third conductive layer comprising a first portion located in the peripheral region, wherein the first portion of the third conductive layer comprises a third wiring located in the first wiring region: a third dielectric layer as a planarization layer located on the third conductive layer: a fourth conductive layer located on the third dielectric layer, the fourth conductive layer comprising a first portion located in the peripheral region, the first portion of the fourth conductive layer comprising a fourth routing located in the first sub-wiring region. The fourth wiring is electrically connected to the third wiring. An orthographic projection of the fourth wiring on the substrate at least partially overlaps with an orthographic projection of the third wiring on the substrate.

In an embodiment of the present disclosure, the third dielectric layer comprises a first via exposing the third wiring located in the first sub-wiring region. The fourth wiring is connected to the third wiring via the first via.

In an embodiment of the present disclosure, the third wiring and the fourth wiring constitute a first power signal line.

In an embodiment of the present disclosure, the first via comprises a first array of first sub-vias and a second array of second sub-vias, the first sub-vias and the second sub-vias being configured such that at least one of the first sub-vias is surrounded by the second sub-vias closest to the at least one first sub-via, and at least one of the second sub-vias is surrounded by the first sub-vias closest to the at least one second sub-via.

In an embodiment of the present disclosure, at least one of the first sub-vias is located at a center of a shape enclosed by the second sub-vias closest to the at least one first sub-via, and at least one of the second sub-vias is located at a center of a shape enclosed by the first sub-vias closest to the at least one second sub-via.

In an embodiment of the present disclosure, a cross-sectional shape of the first via along a plane parallel to the substrate comprises a truncated square.

In an embodiment of the present disclosure, a side of the truncated square has a length of 11 μm.

In an embodiment of the present disclosure, the first portion of the fourth conductive layer comprises a second via exposing the third dielectric layer.

In an embodiment of the present disclosure, the second via comprises a first array of third sub-vias and a second array of fourth sub-vias. The third sub-vias and the fourth sub-vias are configured such that at least one of the third sub-vias is surrounded by the fourth sub-vias closest to the at least one third sub-via, and at least one of the fourth sub-vias is surrounded by the third sub-vias closest to the at least one fourth sub-via.

In an embodiment of the present disclosure, at least one of the third sub-vias is located at a center of a shape enclosed by the fourth sub-vias closest to the at least one third sub-via. At least one of the fourth sub-vias is located at a center of a shape enclosed by the third sub-vias closest to the at least one fourth sub-via.

In an embodiment of the present disclosure, a cross-sectional shape of the second via along a plane parallel to the substrate comprises a square.

In an embodiment of the present disclosure, a side of the square has a length of 16 μm.

In an embodiment of the present disclosure, at least one of the first vias is located at a center of a shape enclosed by the second vias closest to the at least one first via. At least one of the second vias is located at a center of a shape enclosed by the first vias closest to the at least one second via.

In an embodiment of the present disclosure, a spacing located between the first via and the second via is 6.5 μm in the first direction. A spacing located between the first via and the second via is 16.5 μm in a second direction parallel to the substrate and perpendicular to the first direction.

In an embodiment of the present disclosure, the display substrate further comprises a thin film transistor located in the display region, the thin film transistor comprising an active layer located on the substrate, a gate insulating layer located on the active layer, and a gate located on the gate insulating layer. The first conductive layer further comprises a second portion located in the display region. The second portion of the first conductive layer comprising the gate of the thin film transistor. The third conductive layer further comprises a second portion located in the display region. The second portion of the third conductive layer comprising a source/drain electrode of the thin film transistor. The source/drain electrode is connected to a source/drain region of the active layer by passing through the first dielectric layer, the second dielectric layer, and the gate insulating layer.

In an embodiment of the present disclosure, the fourth conductive layer further comprises a second portion located in the display region. The second portion of the fourth conductive layer is connected to the source/drain electrode of the thin film transistor by passing through the third dielectric layer.

In an embodiment of the present disclosure, the display substrate further comprises a fourth dielectric layer as a planarization layer located on the fourth conductive layer; and an encapsulation layer located on the fourth dielectric layer.

In an embodiment of the present disclosure, the display substrate further comprises a light emitting device located in the display region and located between the fourth dielectric layer and the encapsulation layer. The light emitting device comprises an anode, a light emitting layer, and a cathode sequentially disposed along a direction perpendicular to the substrate. The anode is located between the fourth dielectric layer and the encapsulation layer. The anode is connected to the second portion of the fourth conductive layer via a via located in the fourth dielectric layer. The display substrate further comprises a pixel definition layer defining a light emitting region located between the fourth dielectric layer and the encapsulation layer. The pixel definition layer has an opening exposing the anode.

In an embodiment of the present disclosure, the first wiring region further comprises a second sub-wiring region located on a side of the first sub-wiring region away from the display region. The display substrate further comprises a dam located in the second sub-wiring region, the dam comprising a first dam portion and a second dam portion sequentially spaced apart along a direction away from the display region. The first dam portion comprises the fourth dielectric layer and the pixel definition layer. The second dam portion comprises the third dielectric layer, the fourth dielectric layer, and the pixel definition layer.

In an embodiment of the present disclosure, the peripheral region further comprises a bending region and a second wiring region sequentially arranged in the first direction away from the display region and on a side of the first wiring region away from the display region. The bending region has an opening passing through the gate insulating layer, the first dielectric layer, and the second dielectric layer and exposing the substrate, and a planarization layer covering the opening. The planarization layer comprises at least one of the third dielectric layer and the fourth dielectric layer. The second wiring region comprises the gate insulating layer, the first dielectric layer, the second dielectric layer, the third conductive layer, the fourth conductive layer, and the fourth dielectric layer sequentially disposed on the substrate along a direction perpendicular to the substrate.

In an embodiment of the present disclosure, the display substrate further comprises a second power signal line located in the peripheral region and surrounding the display region and the first power signal line. The second power signal line comprises at least one of a portion of the third conductive layer located in the peripheral region and a portion of the fourth conductive layer located in the peripheral region. The first power signal line is configured to provide a first voltage. The second power signal line is configured to provide a second voltage. The first voltage is higher than the second voltage.

In an embodiment of the present disclosure, the display substrate further comprises a passivation layer located between the third conductive layer and the third dielectric layer.

In an embodiment of the present disclosure, an orthographic projection of the first wiring on the substrate at least partially overlaps with an orthographic projection of the first via and the second via on the substrate. An orthographic projection of the second wiring on the substrate at least partially overlaps with an orthographic projection of the first via and the second via on the substrate.

In an embodiment of the present disclosure, the encapsulation layer sequentially covers the first sub-wiring region and the dam in a direction parallel to the substrate and away from the display region. At least a portion of an edge of the encapsulation layer is located within the second sub-wiring region.

In an embodiment of the present disclosure, the first power signal line further comprises a portion located in the second sub-wiring region, the bending region, and the second wiring region and disposed in the same layer as the third conductive layer and/or the fourth conductive layer.

Embodiments of the present disclosure provide a display device. The display device includes the display substrate as described above.

Further aspects and areas of applicability will become apparent from the description provided herein. It should be understood that various aspects of the present application may be implemented individually or in combination with one or more other aspects. It should also be understood that the description and specific examples herein are intended for purposes of illustration only and are not intended to limit the scope of the present application.

BRIEF DESCRIPTION OF THE DRAWINGS

The drawings described herein are for illustrative purposes only of selected embodiments and not all possible implementations, and are not intended to limit the scope of the present application.

Corresponding reference numerals indicate corresponding parts or features throughout the several diagrams of the drawings.

DETAILED DESCRIPTION

Figure 1:
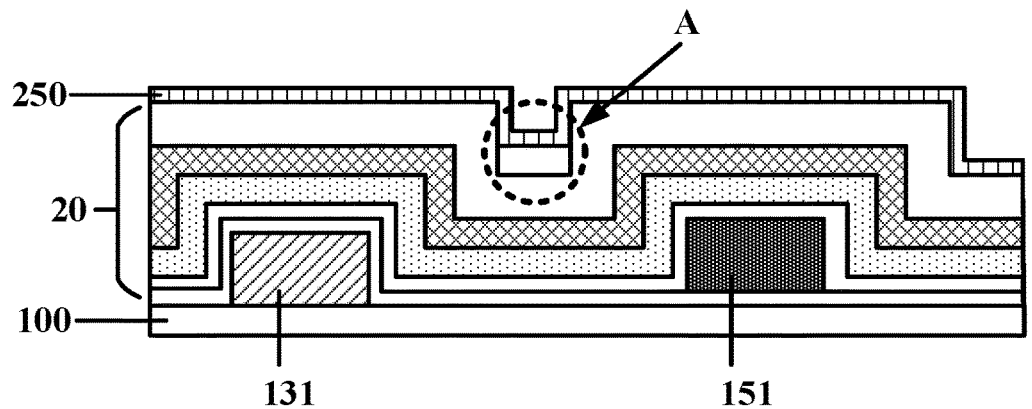
FIG. 1 illustrates a portion of a schematic cross-sectional view of a peripheral region of a display substrate.

Firstly, it should be noted that, as used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively. Likewise, the terms "include", "including" and "or" should all be construed to be inclusive, unless such a construction is clearly prohibited from the context. The term "example" used herein, particularly when followed by a listing of terms, is merely exemplary and illustrative and should not be deemed to be exclusive or comprehensive.

Additionally, further to be noted, when the elements and the embodiments thereof of the present application are introduced, the articles "a/an", "one", "the" and "said" are intended to represent the existence of one or more elements. Unless otherwise specified, "a plurality of" means two or more. The expressions "comprise", "include", "contain" and "have" are intended as inclusive and mean that there may be other elements besides those listed. The terms such as "first" and "second" are used herein only for purposes of description and are not intended to indicate or imply relative importance and the order of formation.

In addition, it should be noted that, in the description of the present disclosure, the orientations or positions relationship indicated by the terms "upper", "above", "lower", "under", "top", "bottom", "between", etc. are the orientations or positions relationship based on the orientations or positions relationship shown in the drawings, which is merely for the convenience of describing the present disclosure and simplifying the description, and does not indicate or imply that the referred device or element has to have a specific orientation and is constructed and operated in a specific orientation, therefore, it can't be understood as a limitation to the disclosure. In addition, when an element or a layer is referred to as being "on" another element or layer, the element or the layer can be directly on the another element or layer, or an intermediate element or layer can be present: likewise, when an element or a layer is referred to as being "under" another element or layer, the element or the layer can be directly under another element or layer, or at least one intermediate element or layer can be present: when an element or a layer is referred to as being between two elements or two layers, the element or the layer can be an unique element or layer between the two elements or the two layers, or more than one intermediate element or layer can be present.

Exemplary embodiments will now be described more fully with reference to the accompanying drawings.

At present, due to an increase in pixels per inch (PPI) of a display substrate, wirings in a peripheral region of the display substrate become more and more, and the wiring layout is complex. As a result, an overlying film layer within a wiring region is extremely not flat. In this case, when a chemical vapor deposition (CVD) film is used for encapsulation, the CVD film, which is the overlying film layer, is susceptible to poorly contact with an underlying film layer, resulting in poor encapsulation. It should be understood that the underlying film layer refers to a single layer or multi-layer film layer formed prior to the overlying film layer.

In particular, FIG. 1 illustrates a portion of a schematic cross-sectional view of a peripheral region of a display substrate. As shown in FIG. 1, the display substrate includes a substrate 100, a first wiring 131 and a second wiring 151 located on the substrate 100, an encapsulation layer (including a CVD film layer) 250 located on the first wiring 131 and the second wiring 151, and a laminated structure 20 located between the first wiring 131 and the second wiring 151 and the encapsulation layer 250. The film layers included in the laminated structure 20 are all conformal. It should be noted that, "conformal" described herein refers to that a surface shape of a formed film layer is consistent or substantially the same as a surface shape of a structure located below the formed film layer. Because the wirings in the peripheral region are more and an arrangement of the wirings is complicated, for example, a spacing located between the first wiring 131 and the second wiring 151 is small. Thus, when forming the encapsulation layer 250, the encapsulation layer 250 is prone to poorly contact with the underlying film layer (e.g., the laminated structure 20, etc.) at a location A. For example, a portion of the encapsulation layer 250) at location A is not in contact with the underlying film layer. As a result, poor encapsulation is further caused.

Embodiments of the present disclosure provide a display substrate capable of improving the flatness of wirings in the peripheral region and significantly avoiding poor contact between the encapsulation layer and the underlying film layer occurring in the peripheral region, such that the encapsulation layer is in good contact with the underlying film layer, thereby avoiding encapsulation defect and improving product yield.

Figure 2:
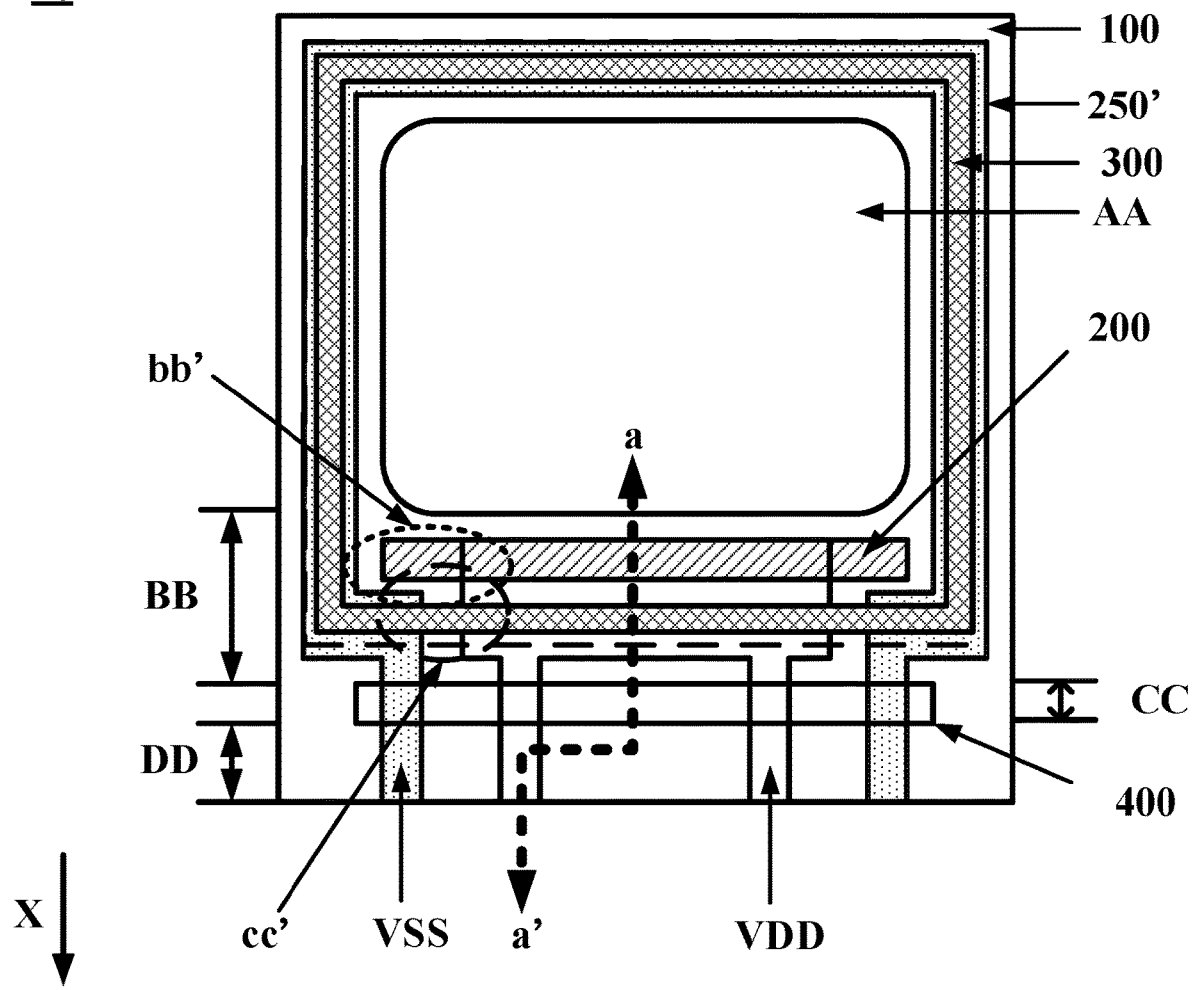
FIG. 2 illustrates a schematic plan view of a display substrate in accordance with an embodiment of the present disclosure.

FIG. 2 illustrates a schematic plan view of a display substrate in accordance with an embodiment of the present disclosure. As shown in FIG. 2, the display substrate 10 may include a substrate 100. The substrate 100 may include a display region AA and a peripheral region surrounding the display region AA. The display substrate 10 may also include a dam 300 surrounding the display region AA, located on the substrate 100 and located in the peripheral region.

Other illustrated portions of FIG. 2 will be described with reference to FIG. 3. In addition, the display substrate of the embodiments of the present disclosure will be further described with reference to FIG. 3.

Figure 3:
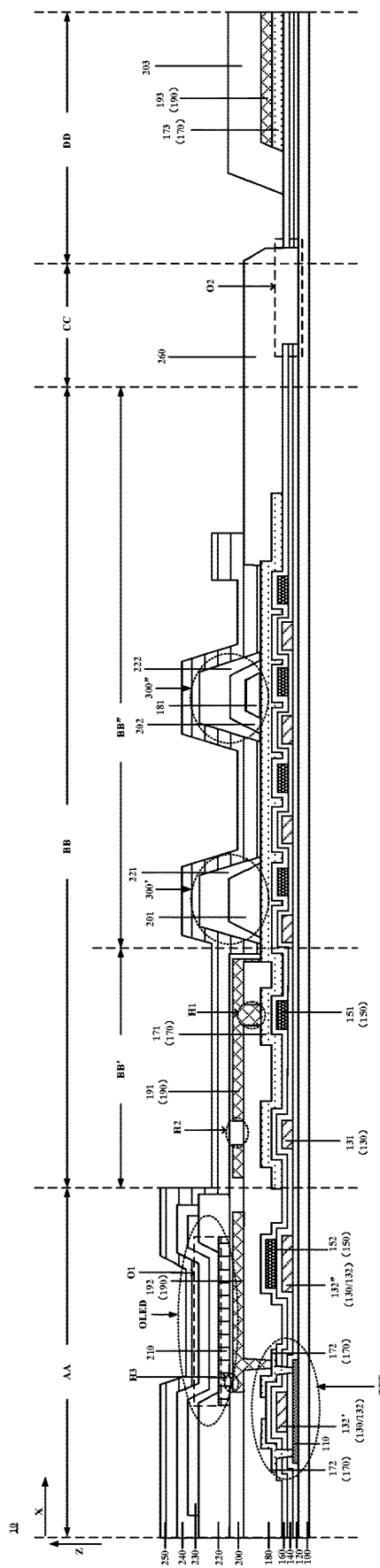
FIG. 3 illustrates a schematic cross-sectional view of a display substrate taken along line aa' in FIG. 2 in accordance with an embodiment of the present disclosure.

It should be noted that the drawing dimensions of FIGS. 2 and 3, as well as the distances between the various regions or components as shown, are for the purpose of illustrating embodiments of the present disclosure and are merely exemplary. It will be appreciated by those skilled in the art that the dimension, spacing, etc. may be adjusted depending on the needs and product design when applied.

FIG. 3 illustrates a schematic cross-sectional view of the display substrate taken along line AA' in FIG. 2 in accordance with an embodiment of the present disclosure. As shown in FIG. 3, the display substrate 10 may include the substrate 100. As described above, the substrate 100 may include the display region AA and the peripheral region surrounding the display region AA. In an embodiment of the present disclosure, the peripheral region may include a first wiring region BB. As an example, the first wiring region BB may be, for example, a first fanout region.

In an exemplary embodiment of the present disclosure, the first wiring region BB may include a first sub-wiring region BB' and a second sub-wiring region BB" sequentially disposed along a first direction X away from the display region AA.

In an embodiment of the present disclosure, the display substrate 10 may further include a first conductive layer 130 located on the substrate 100. The first conductive layer 130 may include a first portion 131 located in the peripheral region. As an example, the first portion 131 of the first conductive layer 130 may include a first wiring (also denoted by reference numeral 131) located in the first wiring region BB.

In an embodiment of the present disclosure, the display substrate 10 may further include a first dielectric layer 140 located on the first conductive layer 130. In an exemplary embodiment of the present disclosure, the first dielectric layer 140 may be conformal. As an example, the first dielectric layer 140 may include an inorganic layer.

In an embodiment of the present disclosure, the display substrate 10 may further include a second conductive layer 150 located on the first dielectric layer 140. The second conductive layer 150 may include a first portion 151 located in the peripheral region. As an example, the first portion 151 of the second conductive layer 150 may include a second wiring (also denoted by reference numeral 151) located in the first wiring region BB.

In an embodiment of the present disclosure, the first wiring 131 and the second wiring 151 are spaced apart from each other along a direction parallel to the substrate 100 (e.g., the first direction X).

In an embodiment of the present disclosure, the display substrate 10 may further include a second dielectric layer 160 located on the second conductive layer 150. In an exemplary embodiment of the present disclosure, the second dielectric layer 160 may be conformal. As an example, the second dielectric layer 160 may include an interlayer dielectric layer. For example, the second dielectric layer 160 may include an inorganic layer.

In an embodiment of the present disclosure, the display substrate 10 may further include a third conductive layer 170 located on the second dielectric layer 160. The third conductive layer 170 may include a first portion 171 located in the peripheral region. As an example, the first portion 171 of the third conductive layer 170 may include a third wiring (also denoted by reference numeral 171) located in the first wiring region BB.

In an embodiment of the present disclosure, the display substrate 10 may further include a third dielectric layer 180 as a planarization layer located on the third conductive layer 170. In an embodiment of the present disclosure, the third dielectric layer 180 is provided to improve the flatness of the wirings located within the peripheral region of the display substrate 10. More specifically, because, for example, the spacing located between the first wiring 131 and the second wiring 151 is small and the overlying film layer is conformal, a surface of the resulting structure is not flat. In contrast, the embodiments of the present disclosure provide the third dielectric layer 180 as a planarization layer over the first wiring 131 and the second wiring 151 and thus obtain a structure surface with improved flatness, facilitating effective contact between the subsequent encapsulation layer and the underlying structure, and thereby improving the encapsulation effect.

In an embodiment of the present disclosure, the display substrate 10 may further include a fourth conductive layer 190 located on the third dielectric layer 180. The fourth conductive layer 190 may include a first portion 191 located in the peripheral region. As an example, the first portion 191 of the fourth conductive layer 190 may include a fourth wiring (also denoted by reference numeral 191) located in the first sub-wiring region BB. In an exemplary embodiment of the present disclosure, the fourth wiring 191 may be electrically connected to the third wiring 171. In an exemplary embodiment of the present disclosure, an orthographic projection of the fourth wiring 191 on the substrate 100 at least partially overlaps with an orthographic projection of the third wiring 171 on the substrate 100.

In an embodiment of the present disclosure, the display substrate 10 may further include a fourth dielectric layer 200 as a planarization layer located on the fourth conductive layer 190. As an example, the fourth dielectric layer 200 may include an organic layer.

In an embodiment of the present disclosure, the display substrate 10 may further include an encapsulation layer 250 located on the fourth dielectric layer 200. As an example, the encapsulation layer 250 may be a film layer formed by chemical vapor deposition.

In an embodiment of the present disclosure, the third dielectric layer 170 may include a first via H1 located in the first sub-wiring region BB' and exposing the third wiring 171. Further, the fourth wiring 191 may be connected to the third wiring 171 via the first via H1. Thus, the resistance of a wiring formed by the third wiring 171 and the fourth wiring 191 is lower, thereby having better electrical performance.

In an embodiment of the present disclosure, the first via H1 may also penetrate through a passivation layer (not shown).

In an exemplary embodiment of the present disclosure, the third wiring 171 and the fourth wiring 191 may constitute at least a portion of a first power signal line VDD (as shown in FIG. 2).

In other exemplary embodiments of the present disclosure, referring to FIGS. 2 and 3, within the first sub-wiring region BB', at least a portion of the first power signal line VDD may be composed of the third wiring 171 and the fourth wiring 191. Within a second sub-wiring region BB' (described later) of the first wiring region BB, at least a portion of the first power line VDD may be composed of the third wiring 171.

An example arrangement of the first via H1 is described below with reference to FIG. 4. It should be understood that the illustration of FIG. 4 is merely a portion of the schematic diagram and is merely exemplary, so as to clearly illustrate embodiments of the present disclosure and should not be taken as a limit to the disclosure.

Figure 4:
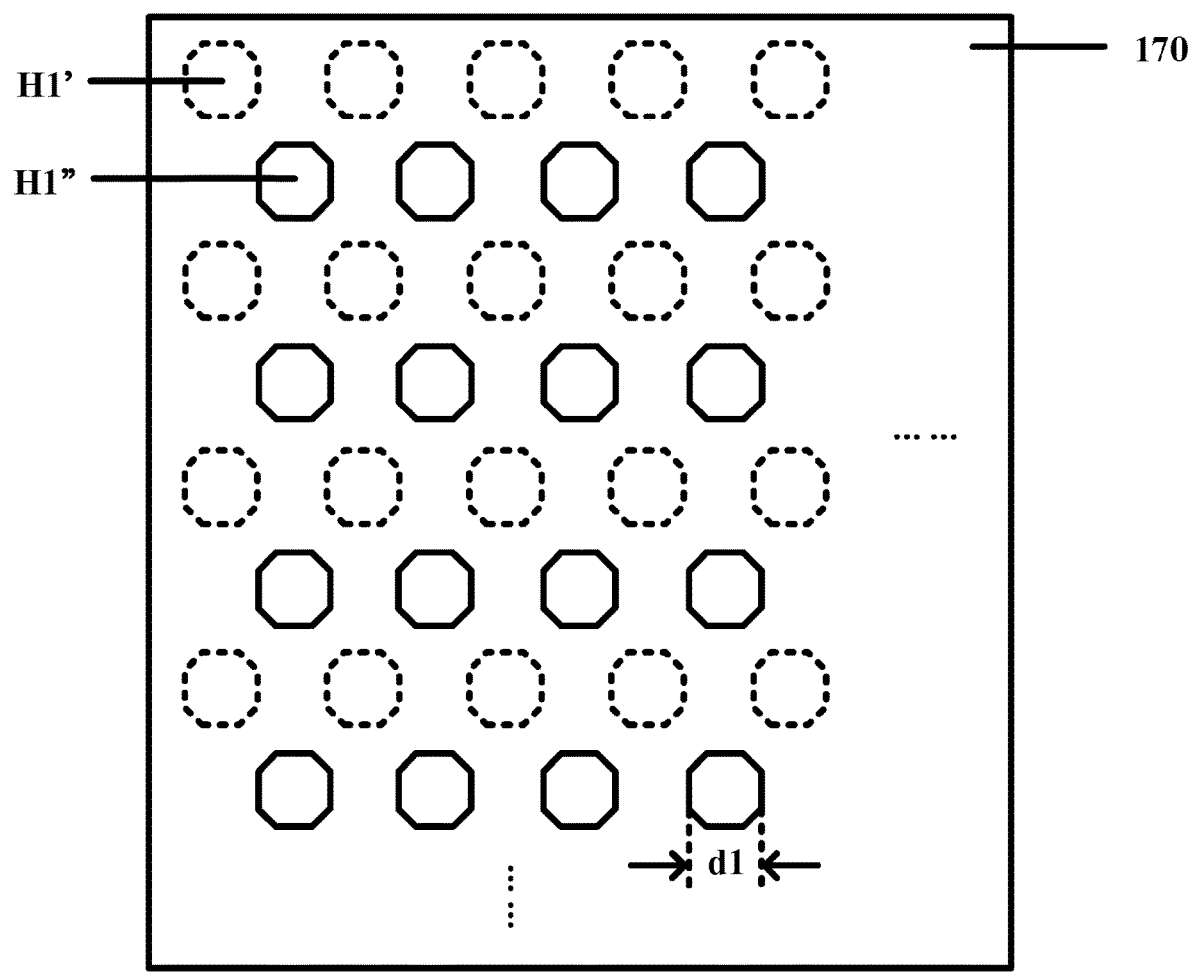
FIG. 4 illustrates a schematic view of a plan arrangement of a first via in accordance with an embodiment of the present disclosure.

FIG. 4 illustrates a schematic view of a plan arrangement of the first via in accordance with an embodiment of the present disclosure. As shown in FIG. 4, in an embodiment of the present disclosure, the first via H1 may include a first array of first sub-vias H1' and a second array of second sub-vias H1". In an exemplary embodiment of the present disclosure, the first sub-vias H1' and the second sub-vias H1" may be configured such that at least one of the first sub-vias H1' may be surrounded by the second sub-vias H1" closest to the at least one first sub-via H1', and at least one of the second sub-vias H1" may be surrounded by the first sub-vias H1' closest to the at least one second sub-via H1".

In an exemplary embodiment of the present disclosure, at least one of the first sub-vias H1' may be located at a center of a shape (e.g., the shape may be a square) enclosed by the second sub-vias H1" closest to the at least one first sub-via H1'. At least one of the second sub-vias H1" may be located at a center of a shape (e.g., the shape may be a square) enclosed by the first sub-vias H1' closest to the at least one second sub-via H1".

In an embodiment of the present disclosure, the position arrangement of the first sub-via and the second sub-via as described above can meet the flatness requirement to the overlying film layer, and can facilitate the electrical contact between the third wiring 171 and the fourth wiring 191. It should be understood that those skilled in the art will be able to set the distribution density and dimension of the first sub-via and the second sub-via as desired, e.g., flatness requirements and electrical characteristic requirements, which are not specifically limited herein.

In an exemplary embodiment of the present disclosure, a cross-sectional shape of the first via H1 along a plane parallel to the substrate 100 may include, for example, a truncated square, as shown in FIG. 4.

In an exemplary embodiment of the present disclosure, a side of the truncated square may have a length d1 of 11 μm. Note that, the length refers to a length of a side of the square before being truncated.

It should be noted that the dimensions of the sub-vias and the spacing located between the sub-vias shown in FIG. 4 are merely exemplary in order to clearly illustrate embodiments of the present disclosure and are not to be considered a limit to the present disclosure. It will be appreciated that the spacing located between the sub-vias may be shown to be larger or smaller.

Referring to FIG. 3 again, in an embodiment of the present disclosure, the first portion 191 of the fourth conductive layer 190 may include a second via H2 exposing the third dielectric layer 180. In an embodiment of the present disclosure, the second via H2 is used for discharging gas remained within the third dielectric layer 180 when the third dielectric layer 180 is formed, otherwise the gas may damage the structural layer of the display substrate, e.g., causing peeling-off, stripping-off, etc. of the first portion 191 of the fourth conductive layer 190 from the underlying film layer.

In an exemplary embodiment of the present disclosure, the third wiring 171 and the fourth wiring 191 may constitute at least a portion of the first power signal line VDD (as shown in FIG. 2). In an exemplary embodiment of the present disclosure, an orthographic projection of the second via H2 on the substrate 100 at least partially overlaps with an orthographic projection of the first power signal line VDD on the substrate 100.

An example arrangement of the second via H2 is described below with reference to FIG. 5. It should be understood that the illustration of FIG. 5 is merely a portion of the schematic diagram and is merely exemplary, so as to clearly illustrate embodiments of the present disclosure and should not be taken as a limit to the disclosure.

Figure 5:
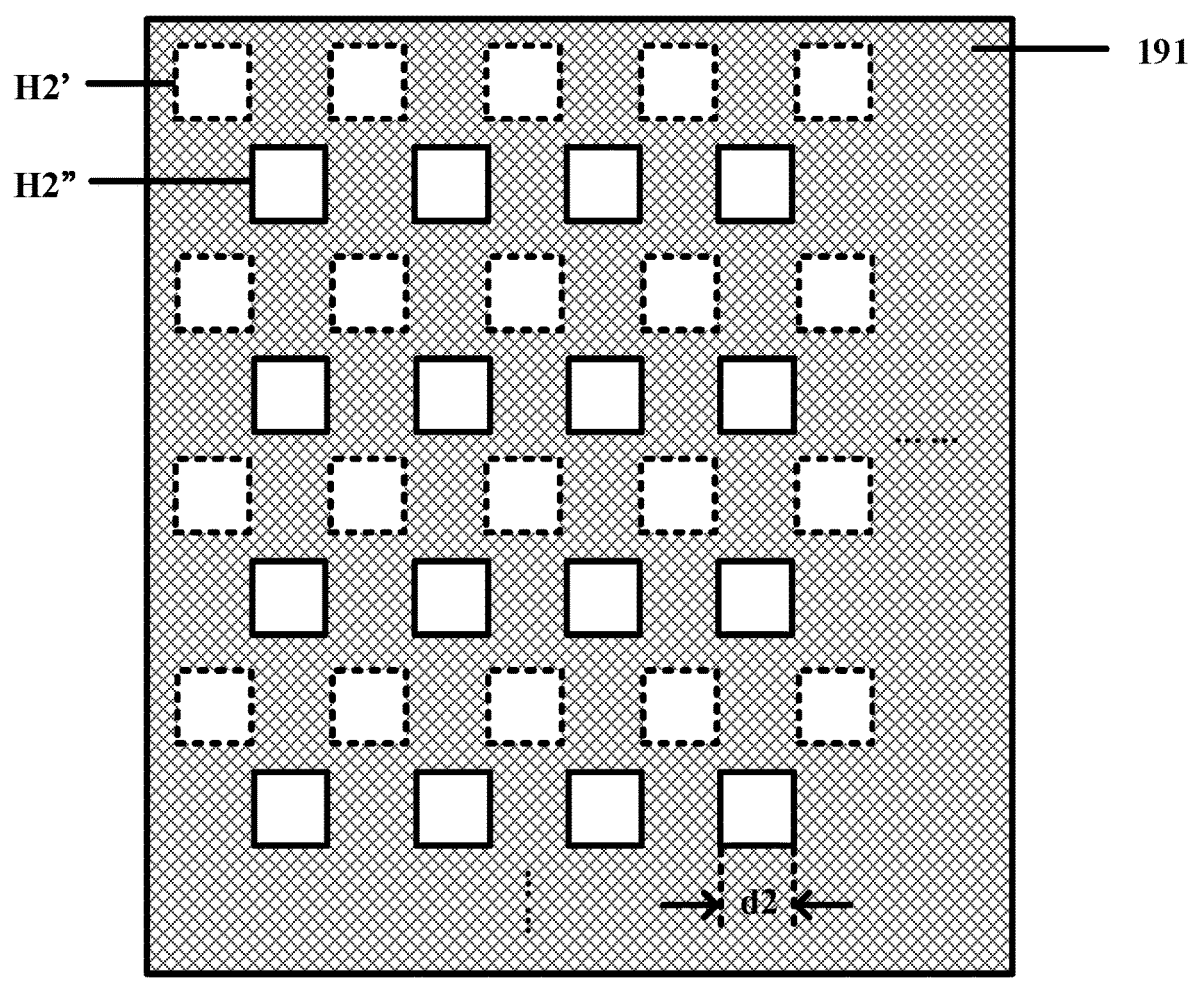
FIG. 5 illustrates a schematic view of a plan arrangement of a second via in accordance with an embodiment of the present disclosure.

FIG. 5 illustrates a schematic view of a plan arrangement of the second via in accordance with an embodiment of the present disclosure. As shown in FIG. 5, in an embodiment of the present disclosure, the second via H2 may include a first array of third sub-vias H2' and a second array of fourth sub-vias H2". In an exemplary embodiment of the present disclosure, the third sub-vias H2' and the fourth sub-vias H2" may be configured such that at least one of the third sub-vias H2' may be surrounded by the fourth sub-vias H2" closest to the at least one third sub-via H2', and at least one of the fourth sub-vias H2" may be surrounded by the third sub-vias H2' closest to the at least one fourth sub-via H2".

In an exemplary embodiment of the present disclosure, at least one of the third sub-vias H2' may be located at a center of a shape (e.g., the shape may be a square) enclosed by the fourth sub-vias H2" closest to the at least one third sub-via H2'. At least one of the fourth sub-vias H2" may be located at a center of a shape (e.g., the shape may be a square) enclosed by the third sub-vias H2' closest to the at least one fourth sub-via H2".

In an embodiment of the present disclosure, the position arrangement of the third sub-via and the fourth sub-via as described above can achieve a good electrical effect, for example, obtain a reduced resistance of the fourth wiring 191. It should be understood that those skilled in the art will be able to set the distribution density and dimension of the third sub-via and the fourth sub-via as desired, e.g., electrical characteristic requirements, which are not specifically limited herein.

In an exemplary embodiment of the present disclosure, a cross-sectional shape of the second via H2 along a plane parallel to the substrate 100 may include, for example, a square, as shown in FIG. 5.

In an exemplary embodiment of the present disclosure, a side of the square may have a length d2 of 16 μm.

It should be noted that the dimensions of the sub-vias and the spacing located between the sub-vias shown in FIG. 5 are merely exemplary in order to clearly illustrate embodiments of the present disclosure and are not to be considered a limit to the present disclosure. It will be appreciated that the spacing located between the sub-vias may be shown to be larger or smaller. In addition, it is to be understood that the shapes of the sub-vias shown in the figures are merely exemplary. For example, when the sub-vias are designed to be square, due to the limitations of the actual process, the sub-via obtained after the actual manufacturing process may have a shape of chamfer (e.g., an included angle between adjacent sides less than or greater than 90 degrees).

An example arrangement of the first via H1 and the second via H2 is described below with reference to FIG. 6. It should be understood that the illustration of FIG. 6 is merely a portion of the schematic diagram and is merely exemplary, so as to clearly illustrate embodiments of the present disclosure and should not be taken as a limit to the disclosure.

Figure 6:
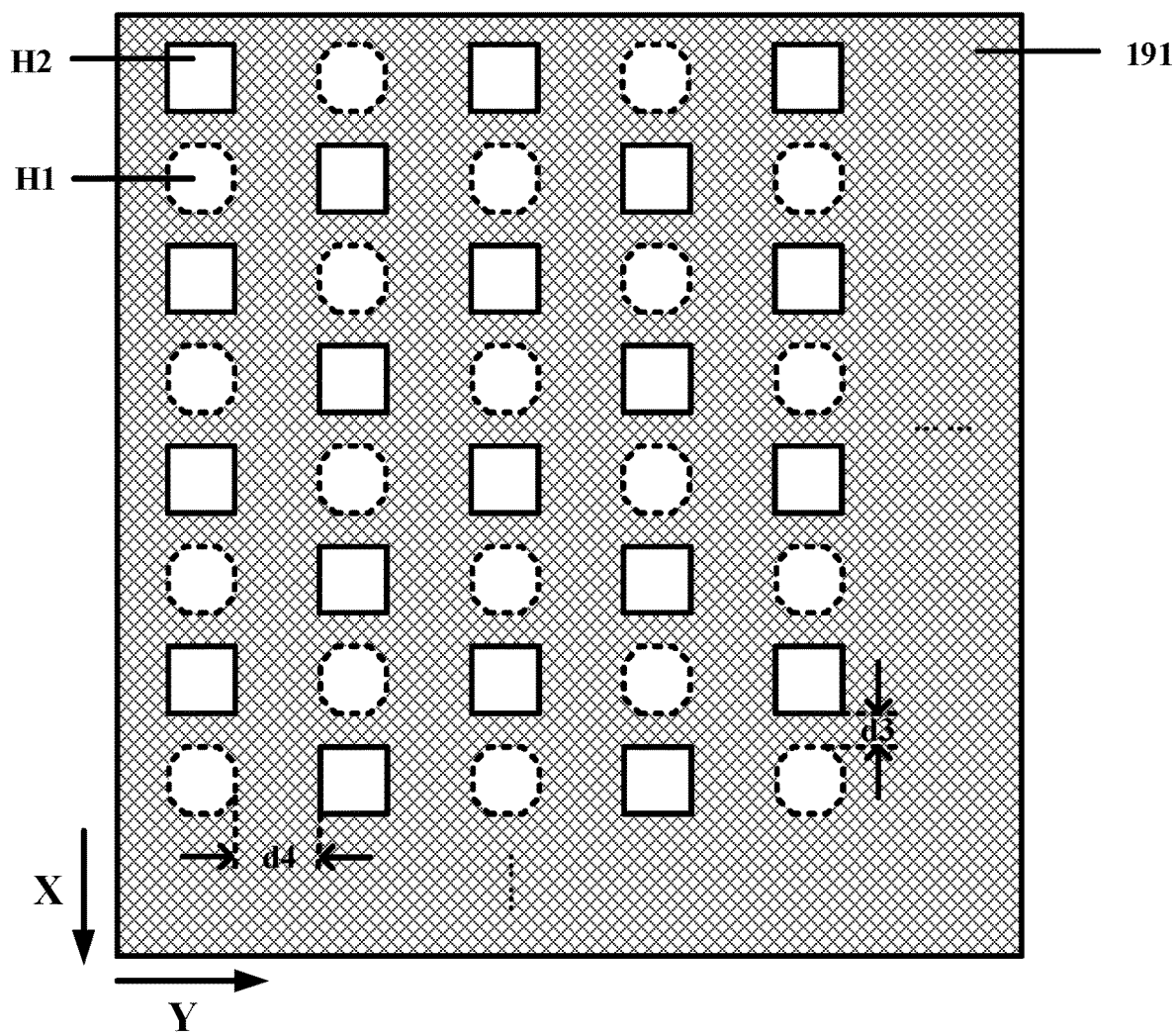
FIG. 6 illustrates a schematic view of a plan arrangement of the first via and the second via in accordance with an embodiment of the present disclosure.

FIG. 6 illustrates a schematic view of a plan arrangement of the first via and the second via in accordance with an embodiment of the present disclosure. As shown in FIG. 6, in an exemplary embodiment of the present disclosure, at least one of the first vias H1 may be located at a center of a shape enclosed by the second vias H2 closest to the at least one first via H1. At least one of the second vias H2 may be located at a center of a shape enclosed by the first vias H1 closest to the at least one second via H2. With this arrangement, the portion of the third dielectric layer 180 located between the first vias H1 is sufficiently discharged of gas.

In an embodiment of the present disclosure, the positional relationship between the first via and the second via is beneficial for the discharge of moisture contained in the third dielectric layer 180 during the process of preparing the third dielectric layer 180, thereby enabling higher yield products. By way of example, the second via H2 may be disposed at a center of a shape enclosed by the surrounding first vias H1 as disclosed in the embodiment of the present disclosure, so as to completely discharge the moisture contained in the third dielectric layer 180 as much as possible. It should be understood that, in one aspect, those skilled in the art can design the position, distribution density and dimension of the first via H1 according to actual needs, such as flatness requirements and electrical characteristic requirements; on the other hand, those skilled in the art can design the position, distribution density and dimension of the second via H2 according to actual needs, such as moisture discharging requirements, and the plan arrangement of the first via H1, which is not specifically limited herein.

In an exemplary embodiment of the present disclosure, in the first direction X, a spacing d3 located between the first via H1 and the second via H2 may be, for example, 6.5 μm. In a second direction Y parallel to the substrate 100 and perpendicular to the first direction X, a spacing d4 located between the first via H1 and the second via H2 may be, for example, 16.5 μm.

Referring again to FIG. 3, in an embodiment of the present disclosure, the display substrate 10 may further include a thin film transistor TFT located in the display region AA. In an exemplary embodiment of the present disclosure, the thin film transistor TFT may include an active layer 110 located on the substrate 100, a gate insulating layer 120 located on the active layer 110, and a gate 132' located on the gate insulating layer 120.

In an embodiment of the present disclosure, the first conductive layer 130 may further include a second portion 132 located in the display region AA. In an exemplary embodiment of the present disclosure, the second portion 132 of the first conductive layer 130 may include the gate 132' of the thin film transistor TFT. In an exemplary embodiment of the present disclosure, the second portion 132 of the first conductive layer 130 may also include a first electrode 132" of a capacitor.

In an embodiment of the present disclosure, the second conductive layer 150 may further include a second portion 152 located in the display region AA. As an example, the second portion 152 of the second conductive layer 150 may include a second electrode (also denoted by reference numeral 152) of the capacitor described above.

It should be understood that the capacitor described above may be configured similar to the capacitor in a conventional pixel driving circuit. Other descriptions regarding capacitor are known in the art and will not be repeated herein.

In an embodiment of the present disclosure, the third conductive layer 170 may further include a second portion 172 located in the display region AA. In an exemplary embodiment of the present disclosure, the second portion 172 of the third conductive layer 170 may include a source/drain electrode (also denoted by reference numeral 172) of the thin film transistor TFT. In an exemplary embodiment of the present disclosure, the source/drain electrodes 172 may be connected to a source/drain region of the active layer 110 by sequentially passing through the second dielectric layer 160, the first dielectric layer 140, and the gate insulating layer 120.

In an embodiment of the present disclosure, the fourth conductive layer 190 may further include a second portion 192 located in the display region AA. In an exemplary embodiment of the present disclosure, the second portion 192 of the fourth conductive layer 190 is connected to the source/drain electrode 172 of the thin film transistor TFT by passing through the third dielectric layer 180. As an example, the second portion 192 of the fourth conductive layer 190 may serve as a power signal line in order to control the operation of the thin film transistor. For example, the power signal line may input a high voltage or a low voltage.

In an embodiment of the present disclosure, the display substrate 10 may further include a light emitting device OLED located in the display region AA and located between the fourth dielectric layer 200 and the encapsulation layer 250. In an exemplary embodiment of the present disclosure, the light emitting device OLED may include an anode 210, a light emitting layer 230, and a cathode 240 sequentially disposed along a third direction Z perpendicular to the substrate 100. In particular, the anode 210 may be located between the fourth dielectric layer 200 and the encapsulation layer 250. Further, the anode 210 may be connected to the second portion 192 of the fourth conductive layer 190 via a third via H3 in the fourth dielectric layer 200.

In an embodiment of the present disclosure, the display substrate 10 may further include a pixel definition layer 220 defining a light emitting region located between the fourth dielectric layer 200 and the encapsulation layer 250. In an exemplary embodiment of the present disclosure, the pixel definition layer 220 may have an opening O1 exposing the anode 210 of the light emitting device OLED.

Referring to FIGS. 2-3, in an embodiment of the present disclosure, the display substrate 10 may further include a dam 300 located in the second sub-wiring region BB". In particular, the dam 300 surrounds the display region AA. The dam 300 may, for example, prevent water and oxygen from entering the display region AA.

In an embodiment of the present disclosure, referring to FIG. 3, in a direction parallel to the substrate 100 and away from the display region AA (e.g., the X-direction), the encapsulation layer 250 may sequentially cover the first sub-wiring region BB and the dam 300, and at least a portion of an edge of the encapsulation layer 250 may be located within the second sub-wiring region BB".

With continued reference to FIG. 3, in an exemplary embodiment of the present disclosure, the dam 300 may at least include a first dam portion 300' and a second dam portion 300" sequentially spaced apart along the first direction X away from the display region AA.

In an exemplary embodiment of the present disclosure, the first dam portion 300' may include the fourth dielectric layer 200 and the pixel definition layer 220. Specifically, the first dam portion 300' may include, for example, a portion 201 of the fourth dielectric layer 200 located in the second sub-wiring region BB" and a portion 221 of the pixel definition layer 220 located in the second sub-wiring region BB". As shown in FIG. 3, the portion 221 of the pixel definition layer 220 may cover a portion of the first portion 171 of the third conductive layer 170 and the portion 201 of the fourth dielectric layer 200.

In an exemplary embodiment of the present disclosure, the second dam portion 300" may include the third dielectric layer 180, the fourth dielectric layer 200 and the pixel definition layer 220. Specifically, the second dam portion 300' may include, for example, a portion 181 of the third dielectric layer 180 located in the second sub-wiring region BB", a portion 202 of the fourth dielectric layer 200 located in the second sub-wiring region BB" and a portion 222 of the pixel definition layer 220 located in the second sub-wiring region BB". As shown in FIG. 3, the portion 202 of the fourth dielectric layer 200 may cover the first portion 171 of the third conductive layer 170 and the portion 181 of the third dielectric layer 181. The portion 222 of the pixel definition layer 220 may cover the first portion 171 of the third conductive layer 170 and the portion 202 of the fourth dielectric layer 200.

It should be understood that the film layers and laminating relationships of the first dam portion 300' and the second dam portion 300" are exemplary only. For example, the first dam portion 300' and the second dam portion 300" may include more film layers or less film layers. Optionally, the dam 300 includes, for example, only one of the first dam portion 300' and the second dam portion 300". It is to be understood that the illustration of FIG. 3 is intended to clearly illustrate embodiments of the present disclosure and should not be taken as a limit to the disclosure.

With continued reference to FIGS. 2-3, in an embodiment of the present disclosure, the peripheral region of the display substrate 10 may further include a bending region CC and a second wiring region DD sequentially arranged in the first direction X away from the display region AA and on a side of the first wiring region BB away from the display region AA. As an example, the second wiring region DD may be, for example, a second fanout region.

Referring to FIG. 3, in an exemplary embodiment of the present disclosure, the bending region CC may have an opening O2 passing through the gate insulating layer 120, the first dielectric layer 180, and the second dielectric layer 200 and exposing the substrate 100 and a planarization layer 260 covering the opening O2. For example, as shown in FIG. 3, the planarization layer 260 may also cover the first portion 171 and the second dielectric layer 160 of the third conductive layer 170.

In an exemplary embodiment of the present disclosure, the planarization layer 260 may include at least one of the third dielectric layer 180 and the fourth dielectric layer 200. More specifically, the planarization layer 260 may include at least one of a portion of the third dielectric layer 180 located in the bending region CC and a portion of the fourth dielectric layer 200 located in the bending region CC.

In an exemplary embodiment of the present disclosure, the second wiring region DD may include the gate insulating layer 120, the first dielectric layer 140, the second dielectric layer 160, the third conductive layer 170, the fourth conductive layer 190, and the fourth dielectric layer 200 sequentially disposed on the substrate 100 along a third direction Z perpendicular to the substrate 100.

More specifically, in an exemplary embodiment of the present disclosure, the second wiring region DD may include a portion of the gate insulating layer 120 located in the second wiring region DD, a portion of the first dielectric layer 140 located in the second wiring region DD, a portion of the second dielectric layer 160 located in the second wiring region DD, a third portion 173 of the third conductive layer 170 located in the second wiring region DD, a third portion 193 of the fourth conductive layer 190 located in the second wiring region DD, and a portion 203 of the fourth dielectric layer 200 located in the second wiring region DD.

With continued reference to FIG. 2, in an embodiment of the present disclosure, the display substrate 10 may further include a second power signal line VSS located in the peripheral region and surrounding the display region AA and the first power signal line VDD.

In an exemplary embodiment of the present disclosure, further, the second power signal line VSS may include at least one of a portion of the third conductive layer 170 located in the peripheral region and a portion of the fourth conductive layer 190 located in the peripheral region.

In an exemplary embodiment of the present disclosure, the first power signal line VDD may be configured to provide a first voltage. The second power signal line VSS may be configured to provide a second voltage. As an example, the first voltage may be higher than the second voltage, for example. It should be noted that the high and low here represent only the relative magnitude relationship between the voltages of the inputs.

In an embodiment of the present disclosure, optionally, the first power signal line VDD may further include a portion located in the second sub-wiring region BB", the bending region CC, and the second wiring region DD and disposed in the same layer as the third conductive layer 170 and/or the fourth conductive layer 190. For the description about "disposed in the same layer", reference may be made to the corresponding descriptions above, and will not be repeated herein.

As an example, the first power signal line VDD may further include a portion located in the second sub-wiring region BB", the bending region CC, and the second wiring region DD and disposed in the same layer as the third conductive layer 170.

As another example, the first power signal line VDD may further include a portion located in the second sub-wiring region BB", the bending region CC, and the second wiring region DD and disposed in the same layer as the fourth conductive layer 190.

As yet another example, the first power signal line VDD may further include a portion located in the second sub-wiring region BB", the bending region CC, and the second wiring region DD and disposed in the same layer as the third conductive layer 170 and the fourth conductive layer 190. In this case, the corresponding portion disposed in the same layer as the third conductive layer 170 and the corresponding portion disposed in the same layer as the fourth conductive layer 190 may be electrically connected via a via, so as to provide the desired electrical performance.

In an embodiment of the present disclosure, the display substrate 10 may further include a passivation layer (not shown) located between the third conductive layer 170 and the third dielectric layer 180. In an exemplary embodiment of the present disclosure, the passivation layer may be conformal. As an example, the passivation layer may include an inorganic layer. It should be understood that the formation of a passivation layer on the third conductive layer 170 may prevent precipitation of materials such as metals that constitute the third conductive layer 170, thereby ensuring the quality of the product.

Details of portion bb' and portion cc' in FIG. 2 will be described below with reference to FIGS. 7-8.

Figure 7:
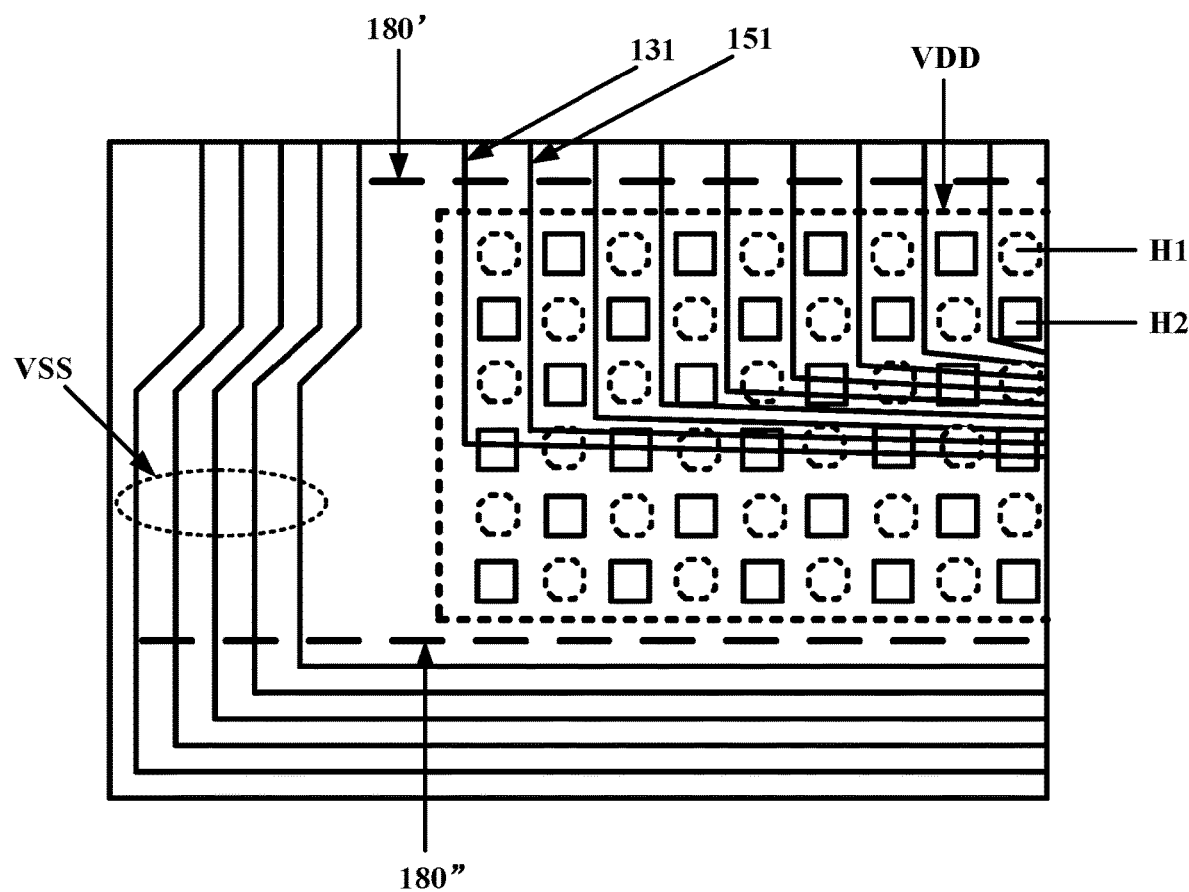
FIG. 7 illustrates an enlarged schematic plan view of the portion bb' in FIG. 2 in accordance with an embodiment of the present disclosure.

FIG. 7 illustrates an enlarged schematic plan view of the portion bb in FIG. 2 in accordance with an embodiment of the present disclosure. Referring to FIGS. 2 and 7, FIG. 7 illustrates a portion of a plan layout of the peripheral region of the display substrate 10. More specifically, FIG. 7 illustrates a portion of a plan layout of the first wiring region BB in the peripheral region of the display substrate 10.

In an exemplary embodiment of the present disclosure, at least a portion of the first power signal line VDD may span an region provided with the third dielectric layer 180. For example, at least a portion of the first power signal line VDD may be located between a boundary 180' of the third dielectric layer 180 close to the display region AA and a boundary 180" of the third dielectric layer 180 away from the display region AA.

In an exemplary embodiment of the present disclosure, referring to FIG. 7, the first wiring 131 and the second wiring 151 may span the boundary 180' of the third dielectric layer 180.

In an exemplary embodiment of the present disclosure, the first wiring 131 and the second wiring 151 may also span portions of the first via H1 and the second via H2.

In an exemplary embodiment of the present disclosure, referring to FIGS. 2-3 and 7, an orthographic projection of the first wiring 131 on the substrate 100 may at least partially overlap with an orthographic projection of the first via H1 and the second via H2 on the substrate 100.

In an exemplary embodiment of the present disclosure, an orthographic projection of the second wiring 151 on the substrate 100 may at least partially overlap with the orthographic projection of the first via H1 and the second via H2 on the substrate 100.

In an exemplary embodiment of the present disclosure, the first wiring 131 may be electrically connected to a data line in the display region. As an example, the data line may be disposed in the same layer as the source/drain electrode 172 of the thin film transistor TFT. For example, the first wiring 131 may be electrically connected to the data line via a via located in the first dielectric layer 140 and the second dielectric layer 160. Here, "disposed in the same layer" refers to the formation by the same film layer at the same step. It should be noted that "the same film layer" in an embodiment of the present disclosure may refer to a film layer located on the same structural layer. Alternatively, for example, the film layer at the same level may be a film layer formed to have a particular pattern by using the same film-forming process. The film layer may then be patterned by one patterning process using the same mask to form the desired layer structure. Depending on different particular patterns, the one patterning process may include multiple exposing, developing, or etching processes. Further, as an example, a particular pattern in the formed layer structure may be continuous or discontinuous. As other example, these particular patterns may be at different heights or have different thicknesses.

In an exemplary embodiment of the present disclosure, the second wiring 151 may be electrically connected to the data line in the display region. Similarly, as an example, the data line may be disposed in the same layer as the source/drain electrode 172 of the thin film transistor TFT. For example, the second wiring 151 may be electrically connected to the data line via a via located in the second dielectric layer 160.

It should be noted that aspects of the data line mentioned above are well known to those skilled in the art, and are not repeated herein.

In an exemplary embodiment of the present disclosure, the second power signal line VSS may span the boundary 180" of the third dielectric layer 180 away from the display region AA. In addition, the second power signal line VSS may partially surround the first power signal line VDD and a portion of the first via H1 and the second via H2.

Figure 8:
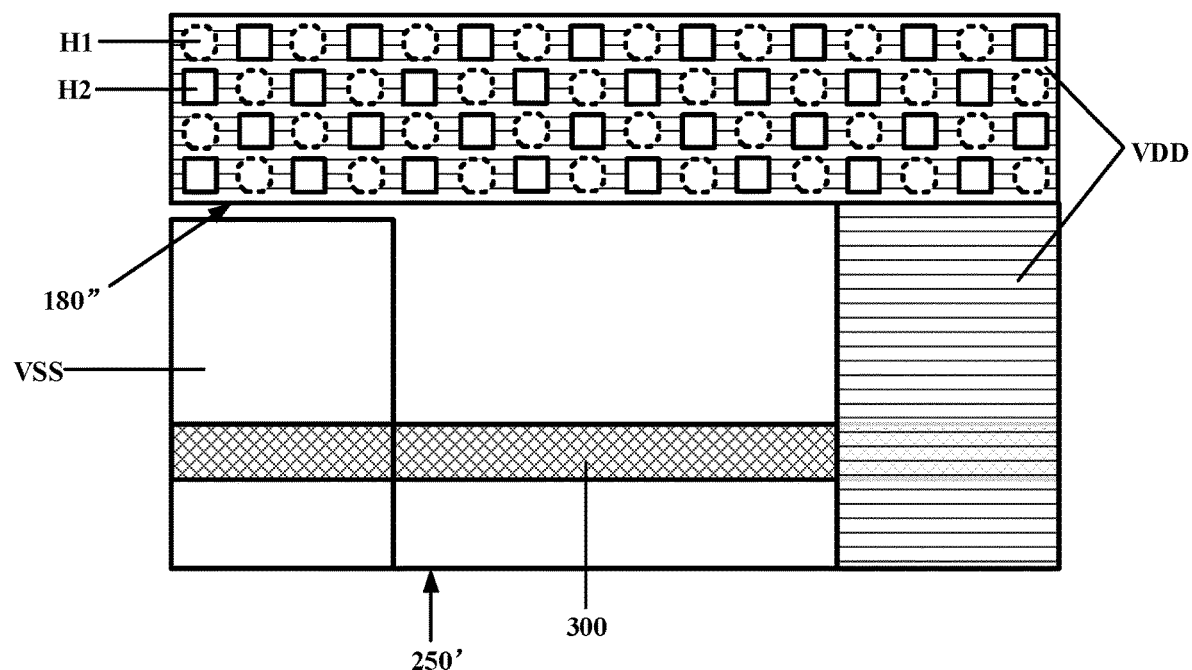
FIG. 8 illustrates an enlarged schematic plan view of portion cc' in FIG. 2 in accordance with an embodiment of the present disclosure.

FIG. 8 illustrates an enlarged schematic plan view of the portion cc' in FIG. 2 in accordance with an embodiment of the present disclosure. Referring to FIGS. 2 and 8, FIG. 8 illustrates a portion of a plan layout of the peripheral region of the display substrate 10. More specifically, FIG. 8 illustrates a portion of a plan layout of the first wiring region BB in the peripheral region of the display substrate 10.

Similar to the positional relationship shown in FIG. 7, the first power signal line VDD may span a portion of the first via H1 and the second via H2.

In addition, in an exemplary embodiment of the present disclosure, as can be seen from FIG. 8, the first power signal line VDD may also have portions that do not span the first via H1 and the second via H2. That is, the first power signal line VDD may have a portion that extends from the boundary 180" of the third dielectric layer 180 away from the display region AA.

In an exemplary embodiment of the present disclosure, the first power signal line VDD and the second power signal line VSS may extend beyond the dam 300 along a direction away from the display region AA.

In an exemplary embodiment of the present disclosure, a boundary 250' of the encapsulation layer 250 is located on a side of the dam 300 away from the display region AA.

In an exemplary embodiment of the present disclosure, the first power signal line VDD and the second power signal line VSS may extend beyond the boundary 250' of the encapsulation layer 250 along a direction away from the display region AA.

In an embodiment of the present disclosure, a display device is also provided. The display device may include the display substrate as described above.

Figure 9:
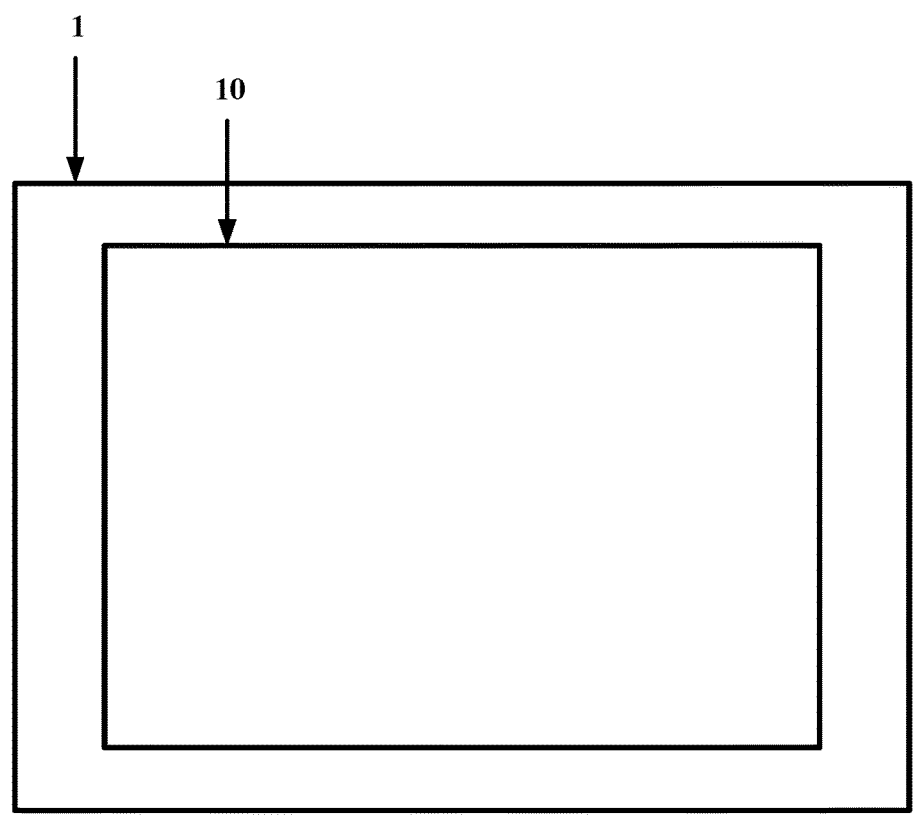
FIG. 9 illustrates a schematic plan view of a display device in accordance with an embodiment of the present disclosure.

FIG. 9 illustrates a schematic plan view of a display device in accordance with an embodiment of the present disclosure. As shown in FIG. 9, the display device 1 may include the display substrate 10.

In an exemplary embodiment of the present disclosure, the display device 1 may be, for example, an OLED display device. As other examples, the display device 1 may be, for example, a mobile phone, a tablet computer, a television, a display, a notebook computer, a navigator, a wearable device, an e-book reader, or the like.

The foregoing description of the embodiment has been provided for purpose of illustration and description. It is not intended to be exhaustive or to limit the application. Even if not specifically shown or described, individual elements or features of a particular embodiment are generally not limited to that particular embodiment, are interchangeable when under a suitable condition, can be used in a selected embodiment and may also be varied in many ways. Such variations are not to be regarded as a departure from the application, and all such modifications are included within the scope of the application.

What is claimed is:

1. A display substrate, comprising:
a substrate comprising a display region and a peripheral region surrounding the display region, the peripheral region comprising a first wiring region, the first wiring region comprising a first sub-wiring region disposed along a first direction away from the display region;
a first conductive layer located on the substrate, the first conductive layer comprising a first portion located in the peripheral region, the first portion of the first conductive layer comprising a first wiring located in the first wiring region;
a first dielectric layer located on the first conductive layer;
a second conductive layer located on the first dielectric layer, the second conductive layer comprising a first portion located in the peripheral region, wherein the first portion of the second conductive layer comprises a second wiring located in the first wiring region, the first wiring and the second wiring being spaced apart from each other along a direction parallel to the substrate;
a second dielectric layer located on the second conductive layer;
a third conductive layer located on the second dielectric layer, the third conductive layer comprising a first portion located in the peripheral region, wherein the first portion of the third conductive layer comprises a third wiring located in the first wiring region;
a third dielectric layer as a planarization layer located on the third conductive layer;
a fourth conductive layer located on the third dielectric layer, the fourth conductive layer comprising a first portion located in the peripheral region, the first portion of the fourth conductive layer comprising a fourth wiring located in the first sub-wiring region,
wherein the fourth wiring is electrically connected to the third wiring,
an orthographic projection of the fourth wiring on the substrate at least partially overlaps with an orthographic projection of the third wiring on the substrate,
the third dielectric layer comprises a first via exposing the third wiring located in the first sub-wiring region, the fourth wiring is connected to the third wiring via the first via, and the first via comprises a first array of first sub-vias and a second array of second sub-vias, the first sub-vias and the second sub-vias being configured such that at least one of the first sub-vias is surrounded by the second sub-vias closest to the at least one first sub-via, and at least one of the second sub-vias is surrounded by the first sub-vias closest to the at least one second sub-via.

2. The display substrate according to claim 1, wherein the third wiring and the fourth wiring constitute a first power signal line.

3. The display substrate according to claim 2, further comprising a second power signal line located in the peripheral region and surrounding the display region and the first power signal line,
wherein the second power signal line comprises at least one of a portion of the third conductive layer located in the peripheral region and a portion of the fourth conductive layer located in the peripheral region,
wherein the first power signal line is configured to provide a first voltage, the second power signal line is configured to provide a second voltage, and the first voltage is higher than the second voltage, and
wherein the first power signal line further comprises a portion located in the second sub-wiring region, the bending region, and the second wiring region and disposed in the same layer as the third conductive layer and/or the fourth conductive layer.

4. The display substrate according to claim 1, wherein at least one of the first sub-vias is located at a center of a shape enclosed by the second sub-vias closest to the at least one first sub-via, and at least one of the second sub-vias is located at a center of a shape enclosed by the first sub-vias closest to the at least one second sub-via.

5. The display substrate according to claim 1, wherein a cross-sectional shape of the first via along a plane parallel to the substrate comprises a truncated square,
wherein a side of the truncated square has a length of 11 µm.

6. The display substrate according to claim 1, wherein the first portion of the fourth conductive layer comprises a second via exposing the third dielectric layer.

7. The display substrate according to claim 6, wherein the second via comprises a first array of third sub-vias and a second array of fourth sub-vias, the third sub-vias and the fourth sub-vias being configured such that at least one of the third sub-vias is surrounded by the fourth sub-vias closest to the at least one third sub-via, and at least one of the fourth sub-vias is surrounded by the third sub-vias closest to the at least one fourth sub-via.

8. The display substrate according to claim 7, wherein at least one of the third sub-vias is located at a center of a shape enclosed by the fourth sub-vias closest to the at least one third sub-via, and at least one of the fourth sub-vias is located at a center of a shape enclosed by the third sub-vias closest to the at least one fourth sub-via.

9. The display substrate according to claim 6, wherein a cross-sectional shape of the second via along a plane parallel to the substrate comprises a square,
wherein a side of the square has a length of 16 µm.

10. The display substrate according to claim 6, wherein at least one of the first vias is located at a center of a shape enclosed by the second vias closest to the at least one first via, and at least one of the second vias is located at a center of a shape enclosed by the first vias closest to the at least one second via.

11. The display substrate according to claim 10, wherein a spacing located between the first via and the second via is 6.5 µm in the first direction,
a spacing located between the first via and the second via is 16.5 µm in a second direction parallel to the substrate and perpendicular to the first direction.

12. The display substrate according to claim 6, wherein an orthographic projection of the first wiring on the substrate at least partially overlaps with an orthographic projection of the first via and the second via on the substrate, and an orthographic projection of the second wiring on the substrate at least partially overlaps with an orthographic projection of the first via and the second via on the substrate.

13. The display substrate according to claim 1, further comprising a thin film transistor located in the display region, the thin film transistor comprising an active layer located on the substrate, a gate insulating layer located on the active layer, and a gate located on the gate insulating layer,
wherein the first conductive layer further comprises a second portion located in the display region, the second portion of the first conductive layer comprising the gate of the thin film transistor, and
wherein the third conductive layer further comprises a second portion located in the display region, the second portion of the third conductive layer comprising a source/drain electrode of the thin film transistor, the source/drain electrode being connected to a source/drain region of the active layer by passing through the first dielectric layer, the second dielectric layer, and the gate insulating layer,
wherein the fourth conductive layer further comprises a second portion located in the display region, the second portion of the fourth conductive layer being connected to the source/drain electrode of the thin film transistor by passing through the third dielectric layer,
wherein the display substrate further comprises a fourth dielectric layer as a planarization layer located on the fourth conductive layer; and
an encapsulation layer located on the fourth dielectric layer.

14. The display substrate according to claim 13, further comprising a light emitting device located in the display region and located between the fourth dielectric layer and the encapsulation layer, the light emitting device comprising an anode, a light emitting layer, and a cathode sequentially disposed along a direction perpendicular to the substrate, wherein the anode is located between the fourth dielectric layer and the encapsulation layer, and the anode is connected to the second portion of the fourth conductive layer via a via located in the fourth dielectric layer,
wherein the display substrate further comprises a pixel definition layer defining a light emitting region located between the fourth dielectric layer and the encapsulation layer, the pixel definition layer having an opening exposing the anode.

15. The display substrate according to claim 14, wherein the first wiring region further comprises a second sub-wiring region located on a side of the first sub-wiring region away from the display region,
wherein the display substrate further comprises a dam located in the second sub-wiring region, the dam comprising a first dam portion and a second dam portion sequentially spaced apart along a direction away from the display region,
wherein the first dam portion comprises the fourth dielectric layer and the pixel definition layer, wherein the second dam portion comprises the third dielectric layer, the fourth dielectric layer, and the pixel definition layer, and wherein the encapsulation layer sequentially covers the first sub-wiring region and the dam in a direction parallel to the substrate and away from the display region, and at least a portion of an edge of the encapsulation layer is located within the second sub-wiring region.

16. The display substrate according to claim 14, wherein the peripheral region further comprises a bending region and a second wiring region sequentially arranged in the first direction away from the display region and on a side of the first wiring region away from the display region, wherein the bending region has an opening passing through the gate insulating layer, the first dielectric layer, and the second dielectric layer and exposing the substrate, and a planarization layer covering the opening, the planarization layer comprising at least one of the third dielectric layer and the fourth dielectric layer, and wherein the second wiring region comprises the gate insulating layer, the first dielectric layer, the second dielectric layer, the third conductive layer, the fourth conductive layer, and the fourth dielectric layer sequentially disposed on the substrate along a direction perpendicular to the substrate.

17. The display substrate according to claim 1, further comprising a passivation layer located between the third conductive layer and the third dielectric layer.

18. A display device comprising a display substrate according to claim 1.

* * * * *